(12) United States Patent
Inoue et al.

(10) Patent No.: US 7,348,714 B2
(45) Date of Patent: Mar. 25, 2008

(54) PIEZOELECTRIC RESONATOR, FILTER AND ELECTRONIC COMPONENT USING THE SAME

(75) Inventors: Kenji Inoue, Tokyo (JP); Hisatoshi Saitou, Tokyo (JP)

(73) Assignee: TDK Corporation, Chuo-ku, Tokyo (JP)

( * ) Notice: Subject to any disclaimer, the term of this patent is extended or adjusted under 35 U.S.C. 154(b) by 285 days.

(21) Appl. No.: 10/901,382

(22) Filed: Jul. 29, 2004

(65) Prior Publication Data
US 2005/0023932 A1 Feb. 3, 2005

(30) Foreign Application Priority Data
Jul. 31, 2003 (JP) ............... 2003-205137

(51) Int. Cl.
*H01L 41/04* (2006.01)
*H01L 41/08* (2006.01)
(52) U.S. Cl. .............. 310/335; 310/334; 333/187; 333/189
(58) Field of Classification Search ......... 310/334, 310/335, 364–366, 323; 333/187–189
See application file for complete search history.

(56) References Cited

U.S. PATENT DOCUMENTS

| | | | |
|---|---|---|---|
| 5,821,833 A * | 10/1998 | Lakin | 333/187 |
| 6,548,942 B1 * | 4/2003 | Panasik | 310/364 |
| 6,720,844 B1 * | 4/2004 | Lakin | 310/328 |
| 6,864,619 B2 * | 3/2005 | Aigner et al. | 310/366 |
| 7,057,478 B2 * | 6/2006 | Korden et al. | 333/189 |
| 2003/0117238 A1 * | 6/2003 | Takeishi et al. | 333/187 |

OTHER PUBLICATIONS

Yasuaki Ishida, et al., "Improvement of Temperature Characteristics of Solidly Mounted Piezoelectric Thin-Film Resonators", Jan. 30, 2003, 81st Research Symposium Report, pp. 7-11.

* cited by examiner

*Primary Examiner*—Darren Schuberg
*Assistant Examiner*—J. Aguirrechea
(74) *Attorney, Agent, or Firm*—McGinn IP Law Group, PLLC

(57) ABSTRACT

A piezoelectric resonator includes; a lower electrode 24 formed on a substrate 11; a piezoelectric film 23 formed on the lower electrode 24; an upper electrode 25 formed on the piezoelectric film 23 and obtaining, in collaboration with the lower electrode 24, a signal having a predetermined resonance frequency by a propagation of a bulk acoustic wave inside the piezoelectric film 23; and an acoustic multilayer reflective film 28 including an $SiO_2$ film 28a having a predetermined acoustic impedance and an AlN film 28b having an acoustic impedance higher than the $SiO_2$ film 28a, and reflecting the bulk acoustic wave, the $SiO_2$ film 28a and the AlN film 28b being alternately stacked on the upper electrode 25, and the $SiO_2$ film 28a being in contact with the upper electrode 25.

19 Claims, 10 Drawing Sheets

PIEZOELECTRIC RESONATOR, FILTER AND ELECTRONIC COMPONENT USING THE SAME

BACKGROUND OF THE INVENTION

The present invention relates to a piezoelectric resonator, and a filter and an electronic component using the piezoelectric resonator, and more particularly, to a technique of effectively suppressing degradation of Q-value (impedance ratio=anti-resonance resistance/resonance resistance) in the piezoelectric resonator or the like.

In a piezoelectric resonator such as a crystal oscillator or the like using a BAW (Bulk Acoustic Wave) and a surface acoustic resonator using a SAW (Surface Acoustic Wave), a dielectric film such as $SiO_2$ film or the like is added to the surface of the resonator. It has been a common practice to use the above technique for the purpose of improving temperature characteristics.

In general, the piezoelectric material has a negative temperature characteristic. When an $SiO_2$ film having a positive temperature characteristic is then added to the piezoelectric material, the negative temperature characteristic of the piezoelectric material is canceled to obtain a favorable temperature characteristics. Further, frequency variation due to an effect of mass addition of $SiO_2$ is used to allow the $SiO_2$ film to serve as a trimming film, or to have a function of exhibiting environment resistance as a protective film.

Note that the technique of forming an $SiO_2$ film onto the surface of the piezoelectric resonator is included, for example, in 81st Research Symposium Report (JAN. 30, 2003) of the 150th Japan Society for the Promotion of Science on Acoustic Wave Technology, entitled "Improvement in temperature characteristics of SMR-type piezoelectric thin film resonator".

For example, in a conventional SMR (Solidly Mounted Resonator)-type piezoelectric resonator, as will later be described more in detail, there is inevitably a problem of degradation of Q-value while improving temperature characteristics of the piezoelectric resonator. Furthermore, the problem described above is relevant not only to the resonator, but also to a filter or an electronic component using the resonator.

SUMMARY OF THE INVENTION

It is therefore an object of the present invention to provide a piezoelectric resonator, a filter and an electronic component using the resonator capable of suppressing the degradation of Q-value while improving the temperature characteristics of the piezoelectric resonator, the filter and the electronic component using the resonator.

Other objects of the present invention will become clear as the description proceeds.

To solve the above problem, according to a first aspect of the present invention, there is provided a piezoelectric resonator comprising: a first electrode film formed on a substrate; a piezoelectric film formed on the first electrode film; a second electrode film formed on the piezoelectric film and obtaining, in collaboration with the first electrode film, a signal having a predetermined resonance frequency by a propagation of a bulk acoustic wave inside the piezoelectric film; and an acoustic multilayer reflective film including a first acoustic film having a predetermined acoustic impedance and a second acoustic film having an acoustic impedance higher than the first acoustic film, and reflecting the bulk acoustic wave, the first acoustic film and the second acoustic film being alternately stacked on the second electrode film, and the first acoustic film being in contact with the second electrode film.

The above invention can suppress degradation of Q-value while improving temperature characteristics.

In a preferred embodiment of the present invention, the first acoustic film is made of $SiO_2$, and the second acoustic film is made of AlN (hereinafter "AlN")or ZnO.

In a preferred embodiment of the present invention, assuming that the wavelength of the bulk acoustic wave is λ, the thickness of the first acoustic film is 0.125 λ or more.

As a result, it is possible to suppress degradation of Q-value while further improving temperature characteristics.

In a preferred embodiment of the present invention, assuming that the wavelength of the bulk acoustic wave is λ, the thickness of the first acoustic film falls within the range of 0.18 λ to 0.225 λ, and that of the second acoustic film falls within the range of 0.05 λ to 0.225 λ.

As a result, both of the improvement in the temperature characteristics and suppression of Q-value degradation can be satisfied in a balanced manner.

In a preferred embodiment of the present invention, assuming that the wavelength of the bulk acoustic wave is λ, the thickness of the first acoustic film falls within the range of 0.275 λ to 0.34 λ, and that of the second acoustic film falls within the range of 0.05 λ to 0.225 λ.

As a result, it is possible to improve particularly the temperature characteristics.

In a preferred embodiment of the present invention, assuming that the wavelength of the bulk acoustic wave is λ, the thickness of the first acoustic film falls within the range of 0.18 λ to 0.225 λ, and that of the second acoustic film falls within the range of 0.275 λ to 0.35 λ.

As a result, it is possible to suppress particularly the degradation of Q-value.

In the above embodiments of the present invention, the piezoelectric resonator may comprise: a third electrode film formed on the acoustic multilayer reflective film; a piezoelectric film formed on the third electrode film; and a fourth electrode film formed on the piezoelectric film and obtaining, in collaboration with the third electrode film, a signal having a predetermined resonance frequency by a propagation of a bulk acoustic wave inside the piezoelectric film.

As a result, two resonators acoustically attached or detached to/from each other can be obtained.

In the above embodiments of the present invention, the piezoelectric resonator is an SMR-type piezoelectric resonator or a diaphragm-type piezoelectric resonator.

As a result, it is possible to suppress degradation of Q-value while further improving temperature characteristics.

To solve the above problem, according to a second aspect of the present invention, there is provided a filter comprising the aforementioned piezoelectric resonator.

The above invention can suppress degradation of Q-value while improving temperature characteristics.

To solve the above problem, according to a third aspect of the present invention, there is provided an electronic component comprising the aforementioned piezoelectric resonator.

The above invention can suppress degradation of Q-value while improving temperature characteristics.

To solve the above problem, according to a fourth aspect of the present invention, there is provided an electronic component comprising the aforementioned filter.

The above invention can suppress degradation of Q-value while improving temperature characteristics.

In a preferred embodiment of the present invention, the piezoelectric resonator or the filter for use in the electronic component is mounted on a substrate and sealed with a resin.

As a result, mechanical joining strength between the substrate and the piezoelectric resonator or the filter can be increased by filling between them with a resin.

As described above, according to the present invention, the following advantage can be obtained.

The acoustic multilayer reflective film formed on the second electrode film brings the piezoelectric film close to a free oscillation state and serves itself as a temperature compensating film. Therefore, it is possible to suppress degradation of Q-value while improving temperature characteristics of the piezoelectric resonator.

DETAILED DESCRIPTION OF THE PREFERRED EMBODIMENTS

Figure 1:
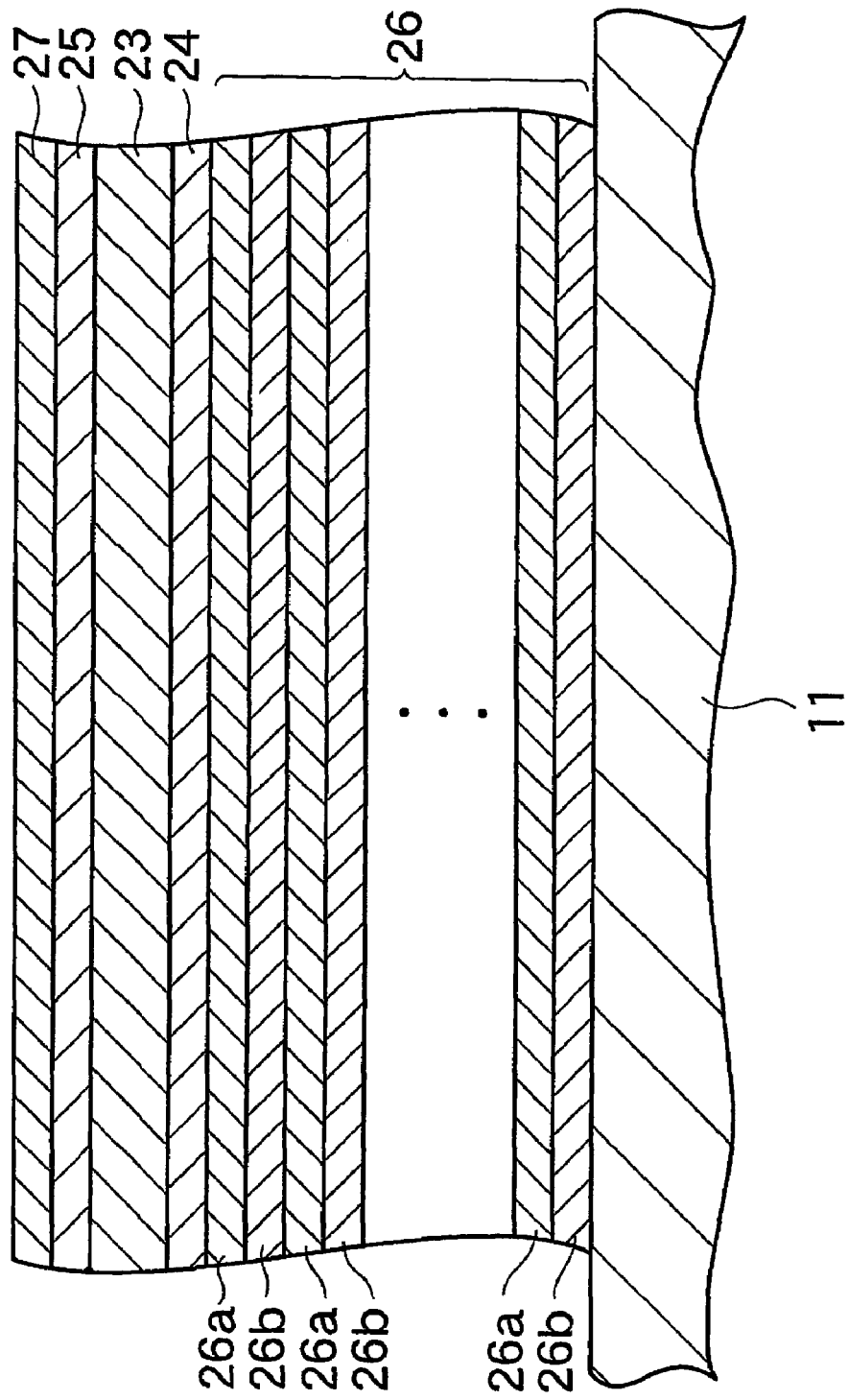
FIG. 1 is a cross-sectional view showing an example of the conventional piezoelectric resonator.
Figure 2:
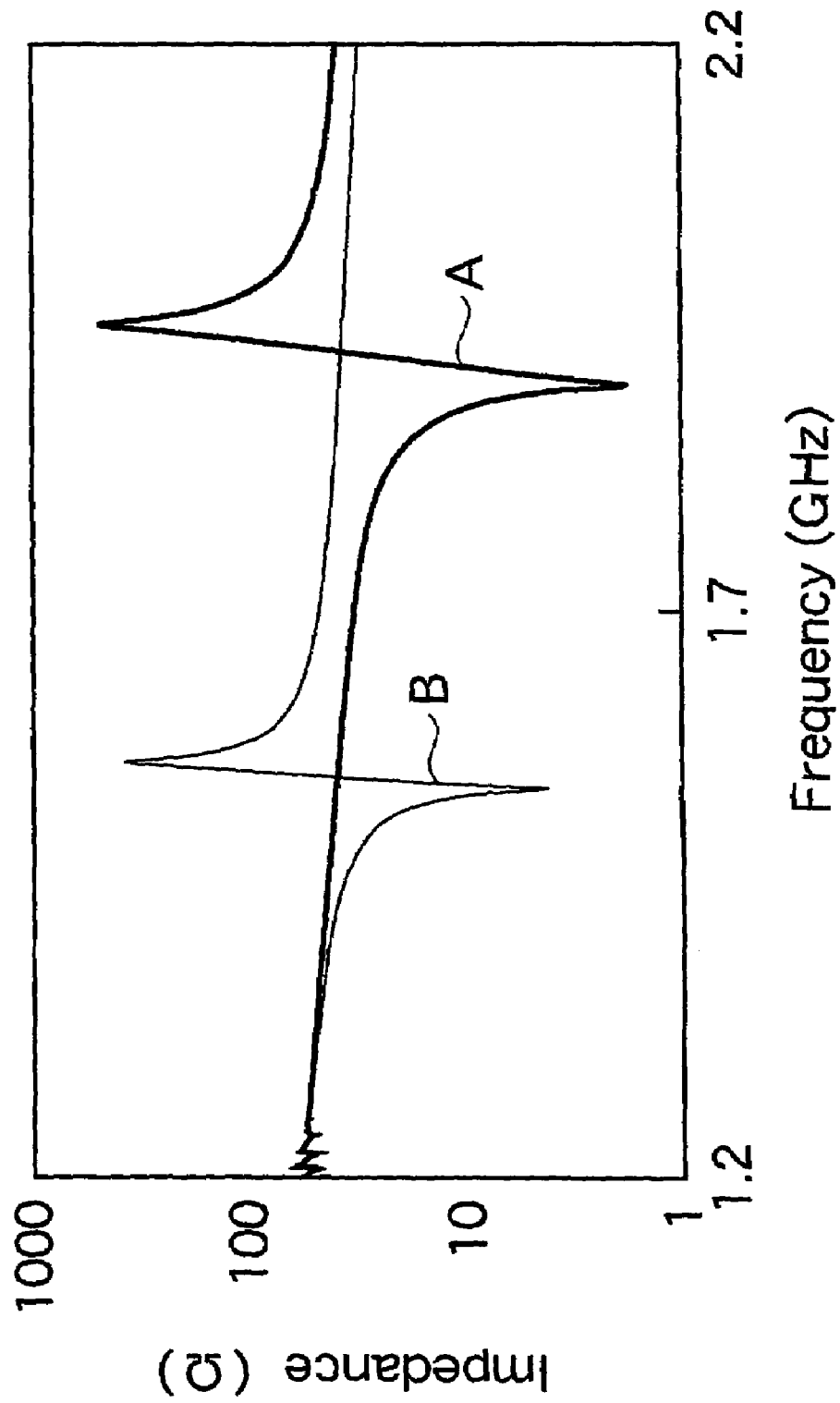
FIG. 2 is a graph showing impedance characteristics of the piezoelectric resonator of FIG. 1, together with impedance characteristics of a piezoelectric resonator having no acoustic multilayer reflective film.

Referring to FIGS. 1 and 2, description is, at first made about the conventional SMR-type piezoelectric resonator in order to facilitate an understanding of the present invention.

In FIG. 1, illustrated is the conventional SMR-type piezoelectric resonator. As shown in FIG. 1, on one side surface of a substrate 11, thin films having a low acoustic impedance and a high acoustic impedance, for example, $SiO_2$ film 26a and AlN film 26b are alternately stacked to form a reflective film 26, on which a lower electrode 24, a piezoelectric film 23 made of AlN, ZnO, or the like, and an upper electrode 25 are sequentially stacked. A dielectric film 27 such as $SiO_2$ film is formed on the upper electrode 25, that is, on the outermost surface of the resonator. Note that, in some cases, the dielectric film 27 is formed between the piezoelectric film 23 and the upper electrode 25.

However, the addition of the film ($SiO_2$ film, in this case) that has no piezoelectric characteristics and therefore does not contribute to vibration adversely affects frequency characteristics of the resonator, such as degradation of Q-value or the like.

More specifically, as shown in FIG. 2, the resonator having the aforementioned $SiO_2$ film of, e.g., 0.5 μm thickness shows impedance characteristic B in which resonance frequency has been shifted to the low frequency side and Q-value has been degraded as compared to impedance characteristic A of the resonator to which $SiO_2$ film is not added. As the film thickness becomes thicker, a temperature compensating function by an effect of the dielectric film is increased, whereas the impedance characteristics are more and more degraded in return. As a result, the thickness of the $SiO_2$ film that can be added to the resonator has limitations. As mentioned in the preamble of the instant specification, the problem described above is relevant not only to the resonator, but also to a filter or an electronic component using the resonator.

Referring now to FIGS. 3 through 10, description will proceed to piezoelectric resonators according to embodiments of the present invention. In the accompanying drawings, the same reference numerals denote the same parts, and the repeated description will be omitted. The following embodiment is shown as a particularly useful example, and the present embodiment is not limited to the embodiment.

Figure 3:
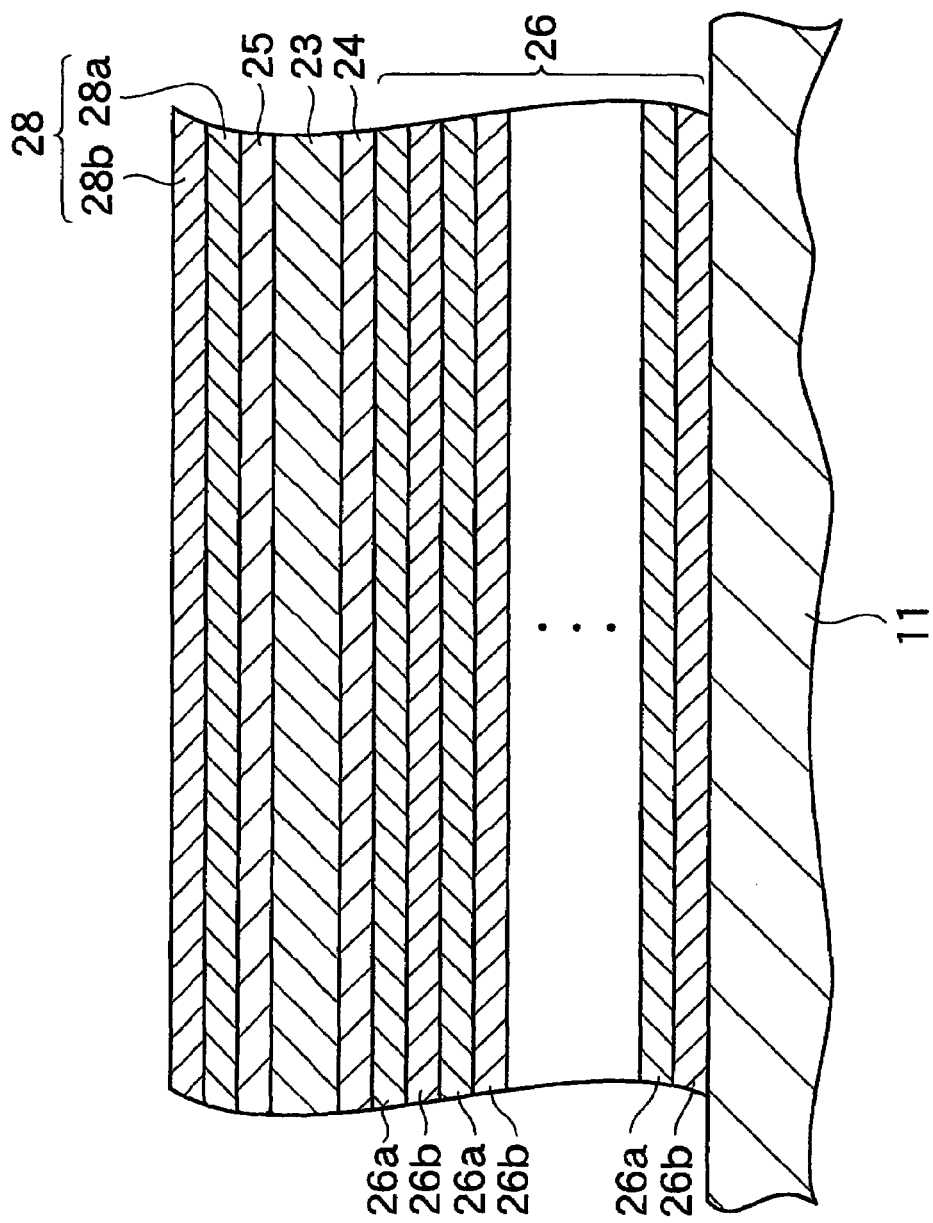
FIG. 3 is a cross-sectional view showing a piezoelectric resonator according to an embodiment of the present invention.
Figure 4:
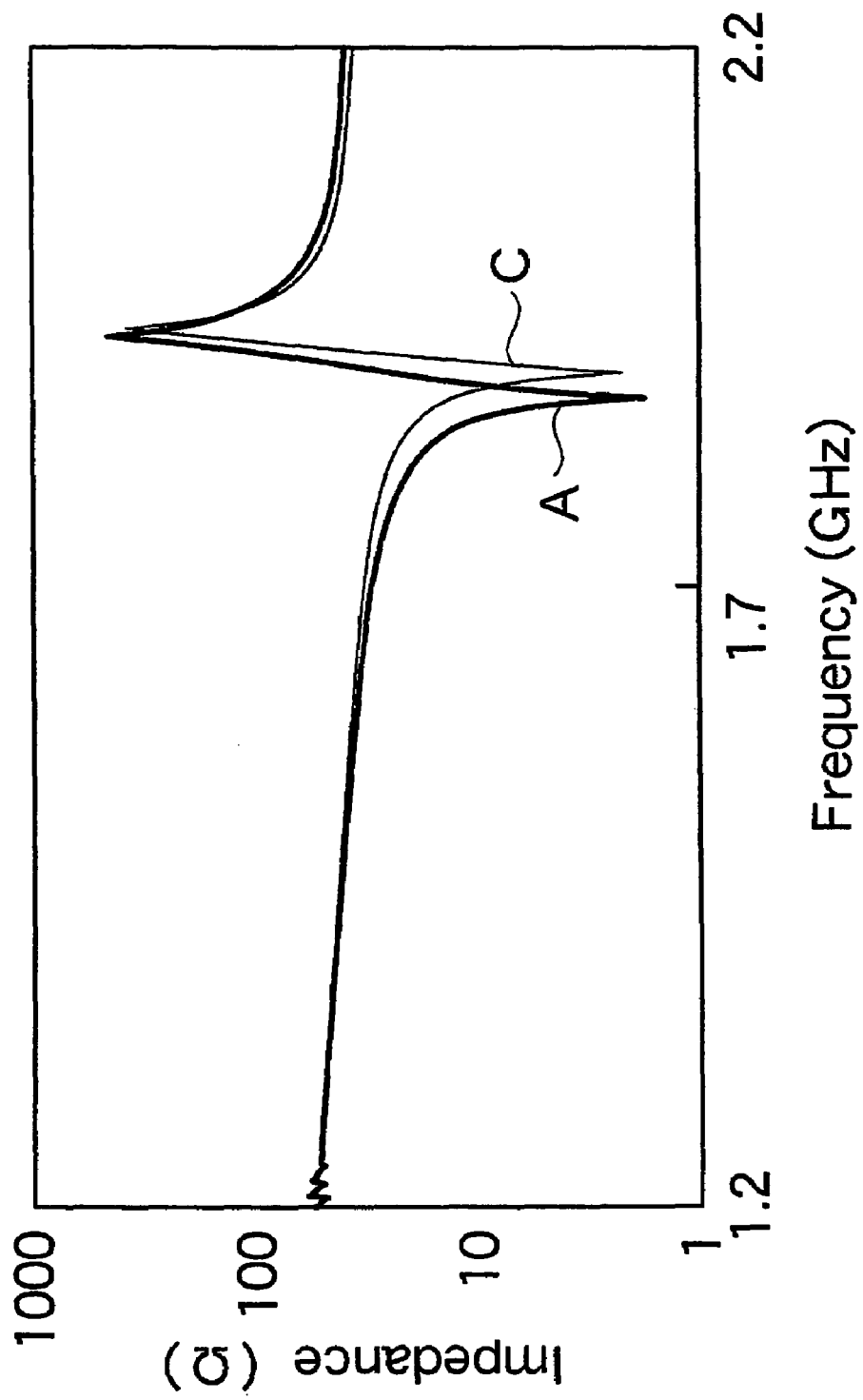
FIG. 4 is a graph showing impedance characteristics of the piezoelectric resonator of FIG. 3, together with impedance characteristics of a piezoelectric resonator having no acoustic multilayer reflective film.
Figure 5:
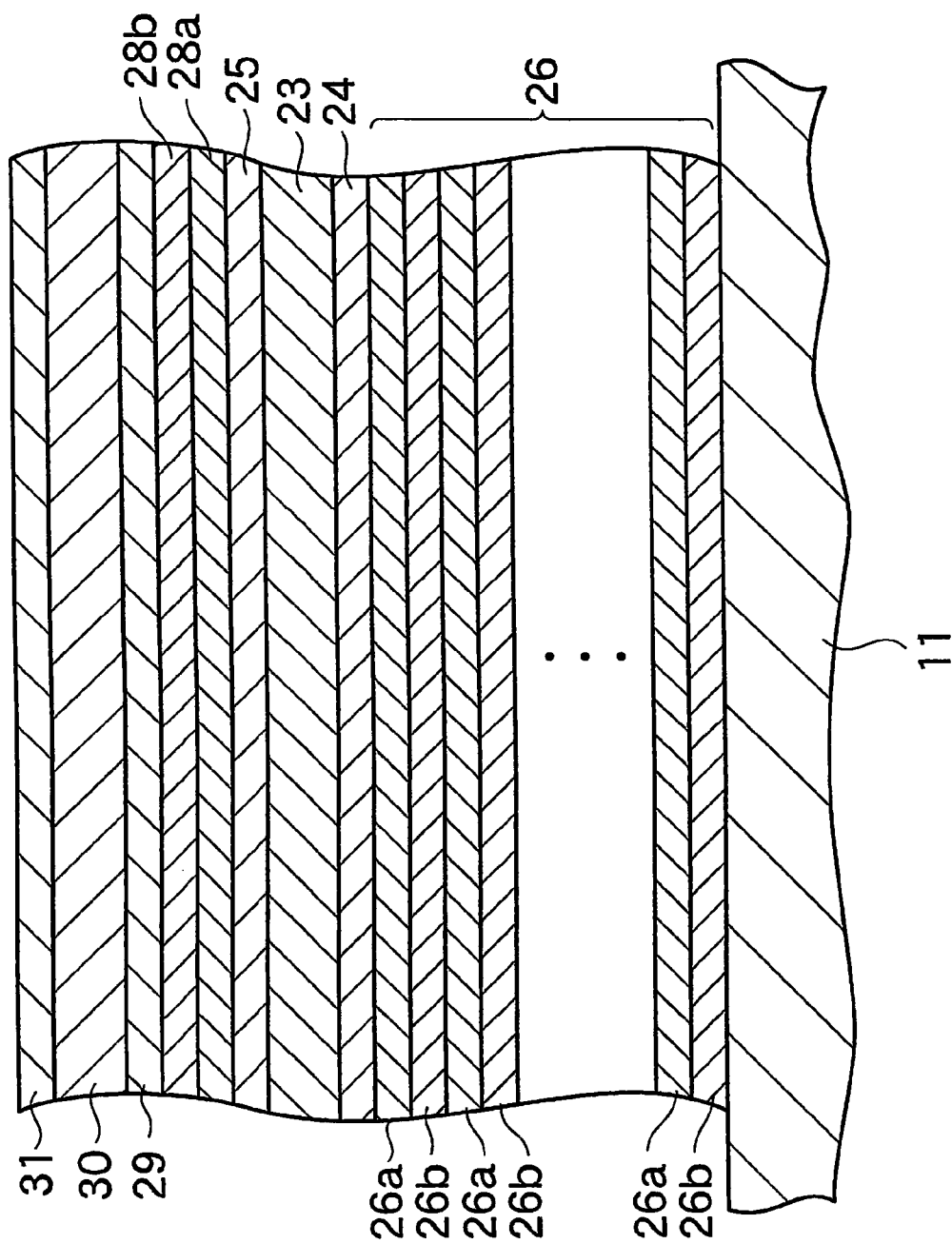
FIG. 5 is a cross-sectional view showing a piezoelectric resonator according to another embodiment of the present invention.
Figure 6:
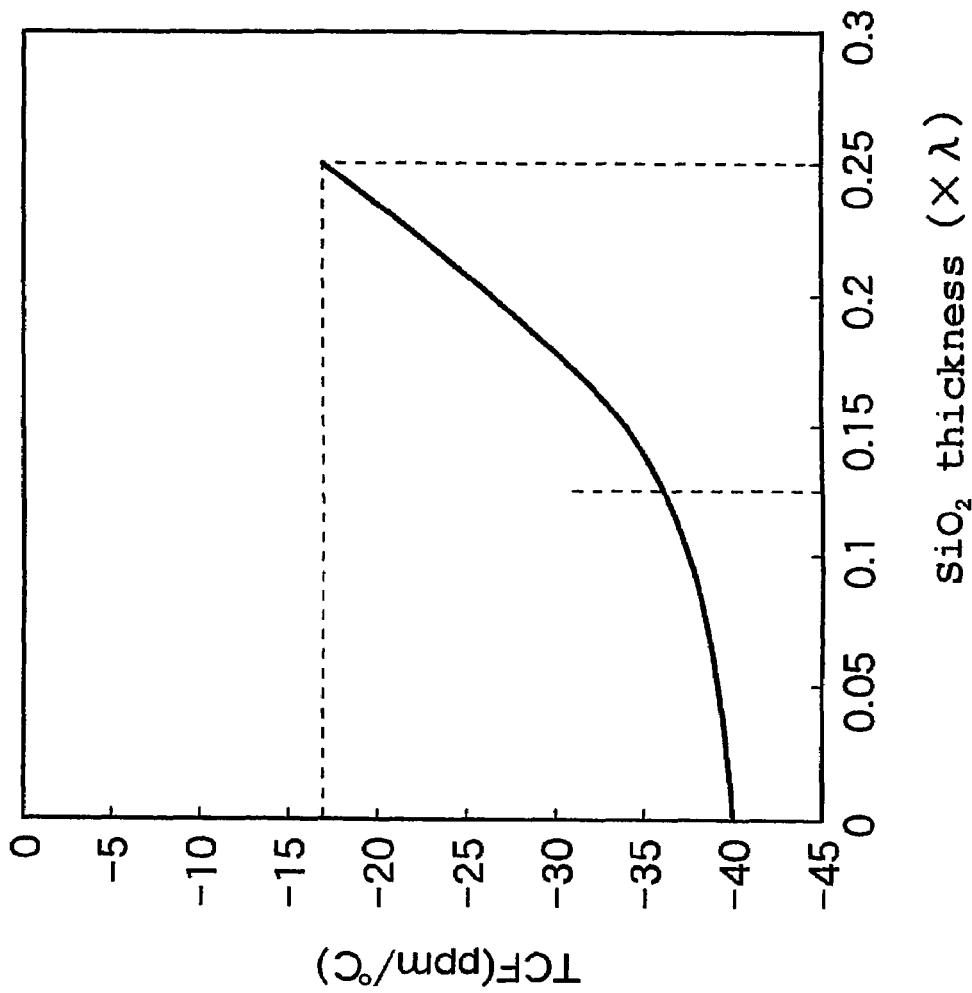
FIG. 6 is a graph showing a relationship between the thickness of an $SiO_2$ film and TCF (Temperature Coefficient of Frequency)
Figure 7:
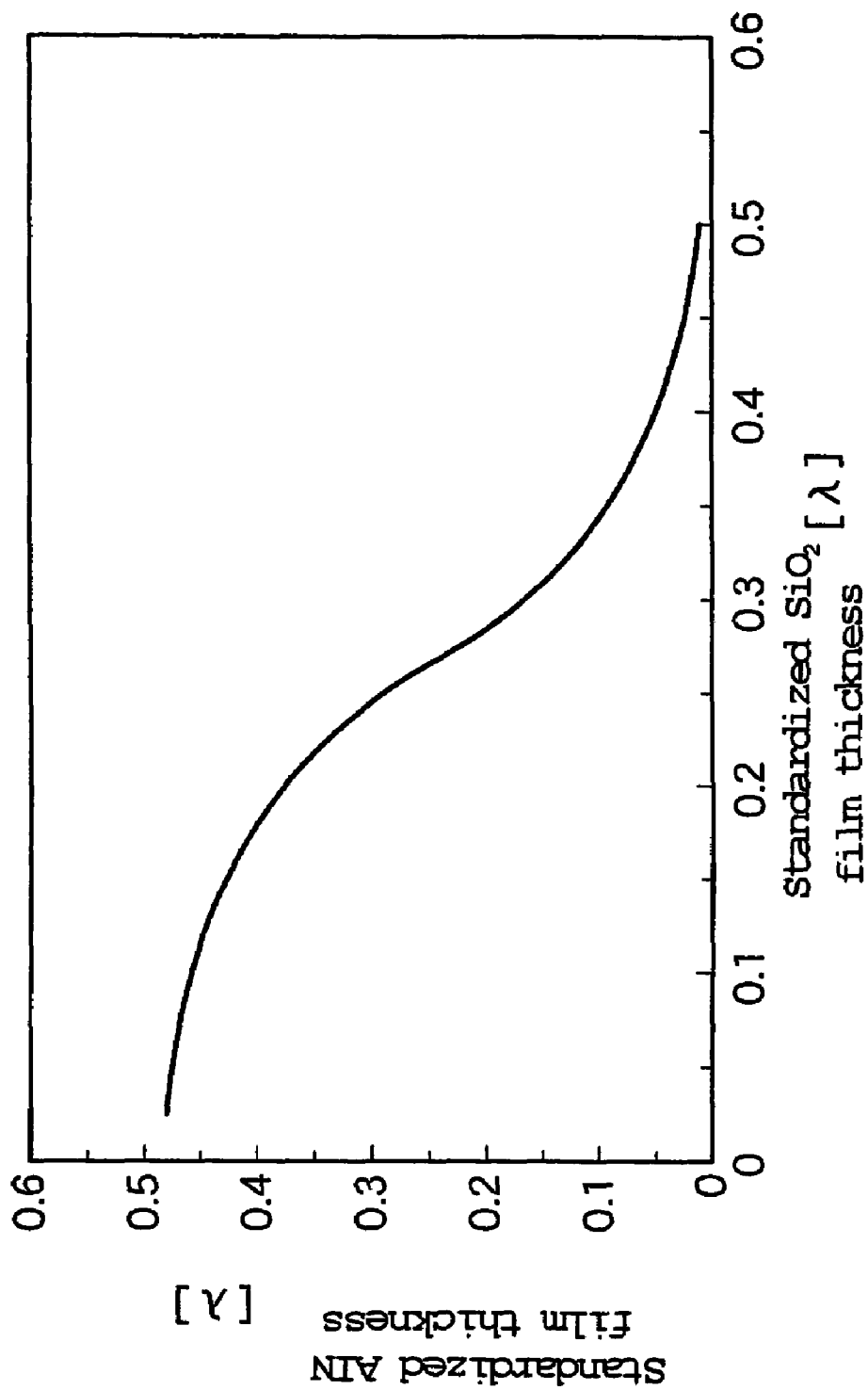
FIG. 7 is a graph showing the upper limit of the normalized film thickness of an AlN film relative to the normalized film thickness of an $SiO_2$ film.
Figure 8:
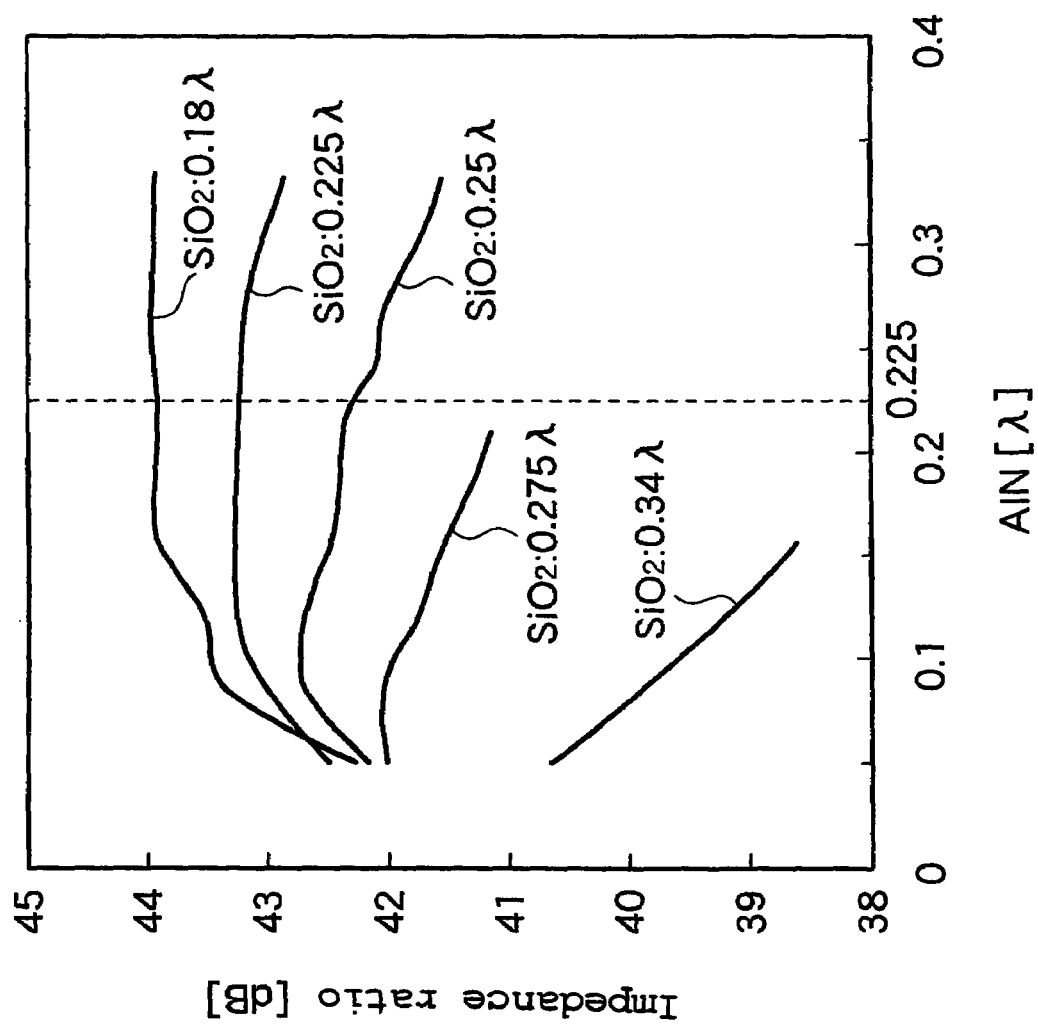
FIG. 8 is a graph showing a relationship between the normalized film thickness of an AlN film and impedance ratio based on the normalized film thickness of an SiO2 film.
Figure 9:
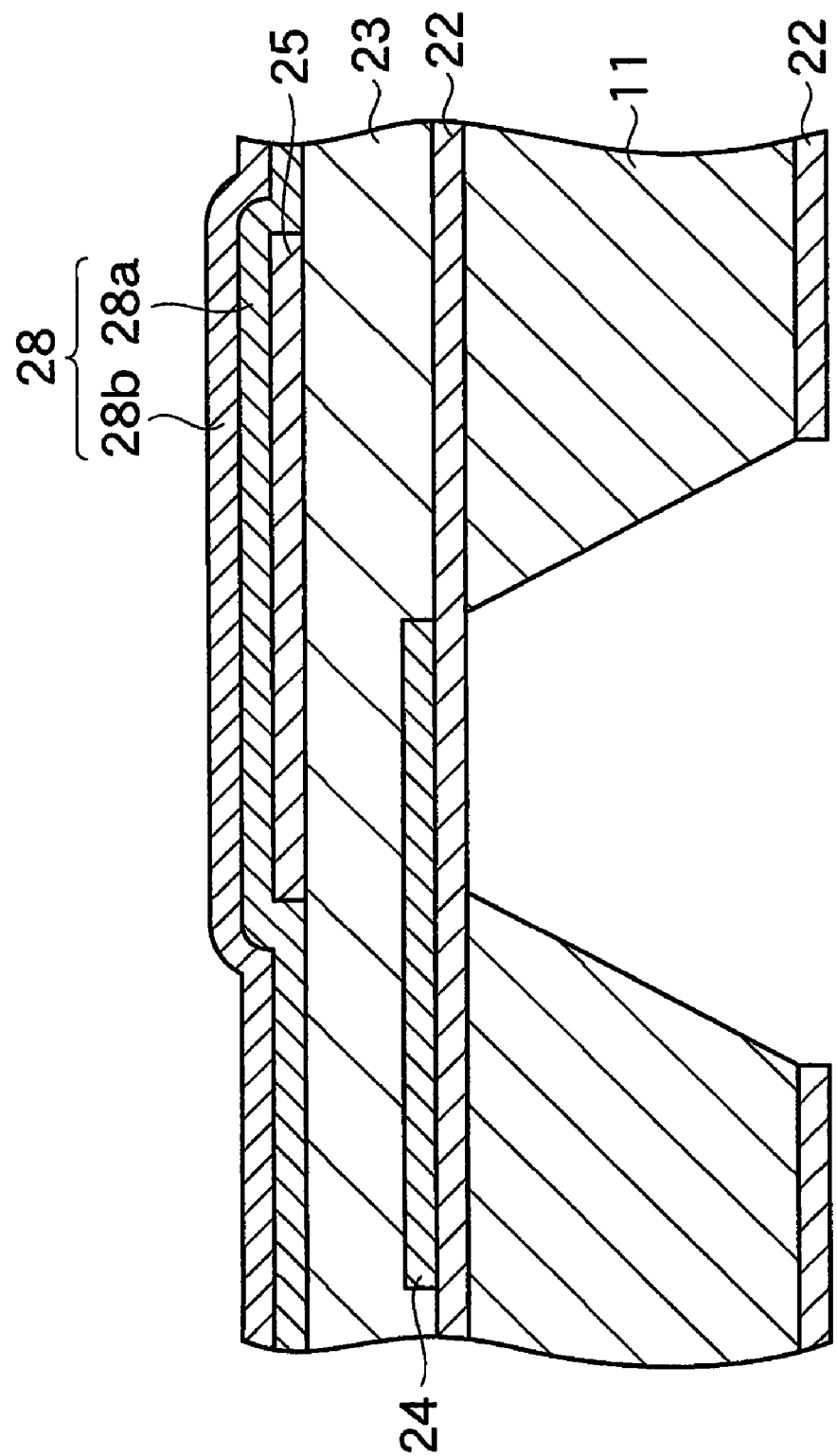
FIG. 9 is a cross-sectional view showing a modification of the piezoelectric resonator shown in FIG. 5.
Figure 10:
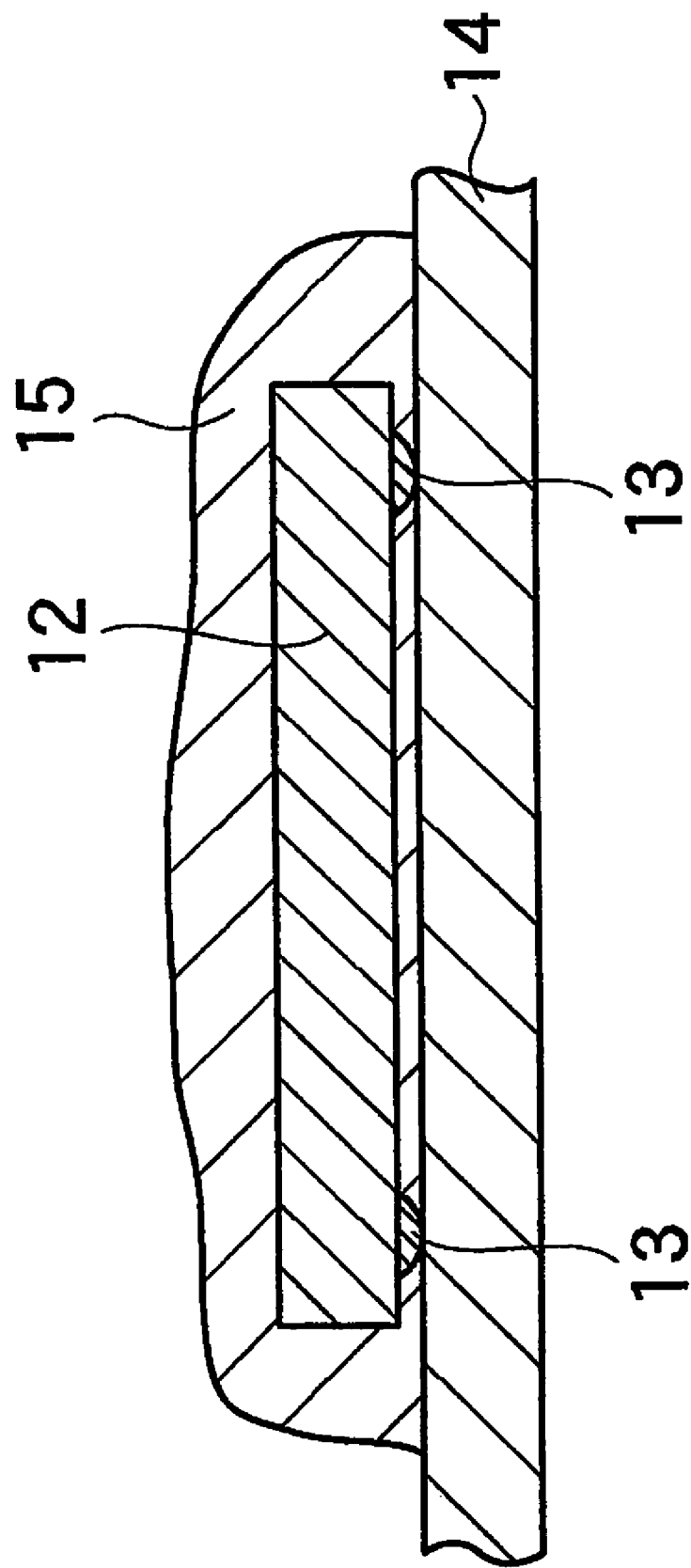
FIG. 10 is a cross sectional view showing a state where the piezoelectric resonator according to the embodiment of the present invention is mounted on a substrate.

FIG. 3 is a cross-sectional view showing a piezoelectric resonator according to an embodiment of the present invention. FIG. 4 is a graph showing impedance characteristics of the piezoelectric resonator of FIG. 3, together with impedance characteristics of a piezoelectric resonator having no acoustic multilayer reflective film. FIG. 5 is a cross-sectional view showing a piezoelectric resonator according to another embodiment of the present invention. FIG. 6 is a graph showing a relationship between the thickness of an $SiO_2$ film and TCF. FIG. 7 is a graph showing the upper limit of the normalized film thickness of an AlN film relative to the normalized film thickness of an $SiO_2$ film. FIG. 8 is a graph showing a relationship between the normalized film thickness of an AlN film and impedance ratio based on the normalized film thickness of an $SiO_2$ film. FIG. 9 is a cross-sectional view showing a modification of the piezoelectric resonator shown in FIG. 5. FIG. 10 is a cross sectional view showing a state where the piezoelectric resonator according to the embodiment of the present invention is mounted on a substrate.

The piezoelectric resonator shown in FIG. 3 is called "SMR (Solidly Mounted Resonator)-type piezoelectric resonator". In the piezoelectric resonator, on one side surface of a substrate 11 made of glass or silicon, thin films having a low acoustic impedance and a high acoustic impedance, for example, an $SiO_2$ film 26a and an AlN film 26b are alternately stacked to form a reflective film 26, on which a lower electrode (first electrode film) 24, a piezoelectric film 23 made of AlN, ZnO, or the like, and an upper electrode (second electrode film) 25 are sequentially stacked. It is possible to obtain the piezoelectric resonator without forming the reflective film 26. In this case, the lower electrode 24 is formed on immediately above the substrate 11.

Sequentially stacked on the upper electrode 25 are an $SiO_2$ film (first acoustic film) 28a, which is a thin film having a predetermined acoustic impedance, and an AlN film (second acoustic film) 28b, which is a thin film having an impedance higher than the impedance of the $SiO_2$ film 28a to form an acoustic multilayer reflective film 28 which reflects a bulk acoustic wave to be described later. The $SiO_2$ film 28a having the lower acoustic impedance comes in contact with the upper electrode 25.

Assuming that twice the thickness of the piezoelectric film 23 is one wavelength ($\lambda$), and is the frequency ($f=v0/\lambda$) defined by the acoustic velocity v0 in the piezoelectric film 23, the thicknesses of the $SiO_2$ film 28a and AlN film 28b are substantially equal to ¼ of the wavelength $\lambda$ of the acoustic waves that propagate through respective films. In other words, the thicknesses of the $SiO_2$ film 28a and AlN film 28b are set such that they correspond to ¼ of the wavelength $\lambda$ of the acoustic waves that propagate through respective films in the vicinity of the resonance frequency of the piezoelectric resonator. In this case, assuming that acoustic velocities in the $SiO_2$ film 28a and AlN film 28b are v1 and v2, respectively, the thicknesses thereof (h1 and h2) are represented by ¼×v1/f, and ¼×v2/f. In the present embodiment, the $SiO_2$ film 28a has a thickness of 0.782 μm, and AlN film 28b has a thickness of 1.48 μm.

Although the present embodiment shows an example of the two-layered acoustic multilayer reflective film 28, the acoustic multilayer reflective film 28 may have a structure in which three layers or more are alternately stacked. In this case, since the $SiO_2$ film 28a comes in contact with the upper electrode 25, the AlN film 28b is formed on the opposite side of the $SiO_2$ film 28a with respect to the upper electrode 25 in the case where the total number of layers is even, whereas the $SiO_2$ film 28a is formed on there in the case where the total number of layers is odd. The thickness of the $SiO_2$ film 28a or the AlN film 28b needs not to be constant. For example, the thicknesses of the $SiO_2$ films 28a may be set such that the $SiO_2$ film 28a that comes in contact with the upper electrode 25 has a thickness of 0.5 μm, and other $SiO_2$ films 28a have thicknesses of 0.782 μm.

Further, as long as the acoustic multilayer reflective film 28 has the structure in which two thin films having different acoustic impedances from each other are alternately stacked, and the one having the lower acoustic impedance comes to contact with the upper electrode 25, the thin films that constitute the acoustic multilayer reflective film 28 are not limited to the $SiO_2$ film 28a and the AlN film 28b. For example, a ZnO film may be used in place of the AlN film.

Further, the thicknesses of the acoustic multilayer reflective film 28, and the $SiO_2$ film 28a and AlN film 28b that constitute the acoustic multilayer reflective film 28 are not limited to the aforementioned values, but can freely be set.

In the above piezoelectric resonator, when alternating voltage is applied to both the lower and upper electrodes 24 and 25, a bulk acoustic wave propagates inside of the piezoelectric film 23 by a piezoelectric effect with the result that a signal having a predetermined resonance frequency can be obtained.

FIG. 4 shows impedance characteristics of the piezoelectric resonator according to the present embodiment shown in FIG. 3. In FIG. 4, reference character C denotes an impedance characteristic of the piezoelectric resonator of the present invention, and reference character A denotes an impedance characteristic of a piezoelectric resonator having no acoustic multilayer reflective film.

In the piezoelectric resonator according to the present embodiment, the acoustic multilayer reflective film 28 that reflects a bulk acoustic wave is formed onto the upper electrode 25. This acoustic multilayer reflective film 28 brings the piezoelectric film 23 close to a free oscillation state and serves itself as a temperature compensating film to improve temperature characteristics of the piezoelectric resonator. Therefore, as shown in FIG. 4, the impedance characteristic C of the resonator according to the present invention, in which its resonance frequency is hardly shifted, is approximately equivalent to the impedance characteristic A of the resonator having no acoustic multilayer reflective film. In addition, Q-value in the impedance characteristic C is hardly degraded in spite of the presence of the acoustic multilayer reflective film 28. The temperature compensating function of the acoustic multilayer reflective film 28 will be described later.

In the conventional resonator to which only the $SiO_2$ film is added, the resonance frequency decreases, so that the decrease in the frequency must be compensated by, for example, reducing a film thickness of an electrode. On the other hand, in the resonator according to the present embodiment using the abovementioned acoustic multilayer reflective film 28, the resonance frequency that is substantially equal to that in the resonator having no acoustic multilayer reflective film can be obtained. Therefore, compensation for the decrease in the frequency is not required.

Further, the AlN film 28b and the $SiO_2$ film 28a, which are positioned on the outermost surface of the resonator, each has a low-frequency sensitivity, making it easy to regulate the frequency by controlling the film thickness.

When the number of the layers of the acoustic multilayer reflective film 28 to be formed on the upper electrode 25 is appropriately set, and a lower electrode (third electrode film) 29, a piezoelectric film 30 and an upper electrode (fourth electrode film) 31 are sequentially stacked on the acoustic multilayer reflective film 28 as shown in FIG. 5, two resonators acoustically attached or detached to/from each other can be obtained.

Here, the temperature compensating function of the acoustic multilayer reflective film 28 will be described. In most of the piezoelectric materials, TCF is less than 0. For example, in the ZnO used in the present embodiment, the TCF is about −40 ppm/° C. The TCF shifts to the positive side as the $SiO_2$ film becomes thicker, as shown in FIG. 6. Thus, the TCF becomes 0 with a predetermined thickness, and becomes positive when the film is further thickened.

In the two-layered acoustic multilayer reflective film 28, the $SiO_2$ film 28a and the AlN film 28b have thicknesses of 0.782 μm and 1.48 μm respectively (in terms of wavelength, a thickness of 0.25 $\lambda$ is obtained for the both films) as described in the present embodiment. In this case, as shown in FIG. 6, the TCF of the resonator having no acoustic multilayer reflective film ($SiO_2$ film thickness is 0) is −40 ppm/° C., whereas the TCF of the resonator having acoustic multilayer reflective film 28 whose $SiO_2$ film thickness is 0.25 $\lambda$ is −17 ppm/° C. That is, an improvement of 23 ppm/° C. is recognized in the temperature characteristics.

The thicknesses of the $SiO_2$ film 28a and the AlN film 28b are not limited to 0.5 $\lambda$, and can appropriately be selected. For example, in the case of using the $SiO_2$ film having a thickness of 0.25 μm, the same advantage as above can be obtained. In this case, the resonance frequency is increased (magnitude of the frequency change is smaller as compared to the conventional resonator). In such a case, it is only necessary to regulate the resonance frequency by, for example, increasing the thickness of the AlN reflective film.

When the $SiO_2$ film becomes thicker, the TCF shifts to the positive side. On the other hand, when the AlN film becomes thicker, the TCF shifts to the negative side. Therefore, by promoting one of the two, or both conditions, the temperature characteristics can be further improved. Note that since the TCF is markedly improved with the $SiO_2$ film thickness of 0.125 λ or more, which can be seen from FIG. 6, it is preferable for the SiO₂ film to have a thickness of at least 0.125 λ or more.

FIG. 7 shows the upper limit of the normalized film thickness of the AlN film relative to the normalized film thickness of the SiO₂ film in the two-layered acoustic multilayer reflective film 28. The resonance frequency varies with the thicknesses of the SiO₂ film and AlN film. The graph of FIG. 7 shows the upper limit of the AlN film thickness with which the resonance frequency of the resonator having the acoustic multilayer reflective film is higher than that of the resonator having no acoustic multilayer reflective film when the SiO₂ film has a certain thickness. That is, the graph shows the most appropriate AlN film thickness with respect to the SiO₂ film thickness. As can be seen from FIG. 7, when the thickness of the SiO₂ film is 0.18 λ, for example, it is preferable for the AlN film to have a thickness of 0.39 λ or less.

The resonance frequency of the resonator having the acoustic multilayer reflective film must be higher than that of the resonator having no acoustic multilayer reflective film because if the resonance frequency becomes lower than that of the resonator having no acoustic multilayer reflective film, vibration energy is leaked to the SiO₂ film 28a that comes in contact with the upper electrode 25, deteriorating the resonant resistance, which in turn degrades the frequency characteristics. Further, the decrease in the frequency must be compensated, involving reduction in the thickness of the electrode or piezoelectric material. On the other hand, when the resonance frequency becomes higher than that of the resonator having no acoustic multilayer reflective film, it is only necessary to reduce the thickness of the electrode, so that electrode resistance can be lowered.

Although the temperature characteristics can be further improved by further increasing the SiO₂ film thickness while further reducing the AlN film thickness as described above, FIG. 7 shows that the thicker the SiO₂ film becomes, the thinner the AlN film having the resonance frequency higher than that of the resonator having no acoustic multilayer reflective film becomes, with the result that the AlN film ends up failing to serve as a reflective film.

Here, in FIG. 8, a relationship between the normalized film thickness of an AlN film and impedance ratio based on the normalized film thickness of an SiO₂ film are shown.

As can be seen from FIG. 8, when the SiO₂ film thickness is allowed to fall within the range of 0.18 λ to 0.225 λ, and the AlN film thickness to fall within the range of 0.05 λ to 0.225 λ, both of the improvement in the temperature characteristics and suppression of Q-value degradation can be satisfied in a balanced manner. When the normalized film thicknesses of the SiO₂ film and AlN film are equal to each other, for example, when both of the normalized film thicknesses of the two films are 0.22 λ or 0.2 λ, the film thickness ratio between the two films becomes 1:1, that is, becomes equal to each other. Accordingly, it is conceivable that the temperature characteristics equivalent to that in the case where the film thicknesses of both of the SiO₂ film and AlN film are 0.25 λ, and favorable Q-value characteristic can be obtained.

Further, when the SiO₂ film thickness is allowed to fall within the range of 0.275 λ to 0.34 λ, and the AlN film thickness to fall within the range of 0.05 λ to 0.225 λ, impedance ratio is somewhat decreased as shown in FIG. 8. However, the aforementioned temperature compensating function of the SiO₂ film is further demonstrated by increasing the SiO₂ film thickness. From this, it can be considered that particularly the temperature characteristics can be improved.

FIG. 8 further shows that when the SiO₂ film thickness is allowed to fall within the range of 0.18 λ to 0.225 λ, and the AlN film thickness to fall within the range of 0.275 λ to 0.35 λ, the temperature compensating function is slightly deteriorated due to the thinning of the SiO₂ film thickness, whereas impedance ratio is increased to suppress particularly the Q-value degradation.

When it is intended to increase the number of the layers of the acoustic multilayer reflective film, the film thickness of each layer should be set such that the resonance frequency is higher than that of the resonator having no acoustic multilayer reflective film. For example, when a three-layered structure is employed in which an SiO₂ film (1), an AlN film, and an SiO₂ film (2) are stacked, it is preferable that the film thickness of the SiO₂ (2) film be set to 0.275 λ or more to allow the resonance frequency to be higher than that of the resonator having no acoustic multilayer reflective film.

While the present invention is applied to the SMR-type piezoelectric resonator in the above description, the present invention is also applicable to a diaphragm-type piezoelectric resonator.

Here, a configuration of the diaphragm-type piezoelectric resonator is shown in FIG. 9.

As shown in FIG. 9, a substrate 11 made of silicon or glass, on both surfaces of which protective films 22 such as an SiO₂ film (oxide film) are formed has, on one side surface, a lower electrode (first electrode film) 24, a piezoelectric film 23 made of AlN, ZnO, or the like, and an upper electrode (second electrode film) 24 which are sequentially stacked. The portion of the substrate 11 that corresponds to the portion where the lower electrode 24 and the upper electrode 25 are overlapped in the stacked direction is cut away by etching or the like for easy propagation of the bulk acoustic wave. An SiO₂ film (first acoustic film) 28a and AlN film (second acoustic film) 28b as described above are sequentially stacked on the upper electrode 25 to form an acoustic multilayer reflective film 28.

Also, a filter having the aforementioned piezoelectric resonator can be configured. Further, an electronic component in which the above piezoelectric resonator and filter are mounted on a substrate can be obtained. Also in this case, the acoustic multilayer reflective film is formed on the upper electrode. Thus, a contact between the surface of a device such as the piezoelectric resonator or filter and some sort of material has little influence on operating characteristics, and therefore, the following is possible: as shown in FIG. 10, a device 12 is fixed, in face-down, onto a substrate 14 through, for example, bumps 13, followed by being sealed with a resin 15 so that the resin is filled between the substrate 14 and the device 12. As a result, mechanical joining strength between the substrate 14 and device 12 can be increased.

What is claimed is:

1. A piezoelectric resonator comprising:
   a first electrode film formed on a substrate;
   a piezoelectric film formed on the first electrode film;
   a second electrode film formed on the piezoelectric film and obtaining, in collaboration with the first electrode film, a signal having a predetermined resonance frequency by a propagation of a bulk acoustic wave inside the piezoelectric film; and
   an oscillation energy confining film including a first acoustic film having a predetermined acoustic impedance and a second acoustic film having an acoustic impedance higher than the first acoustic film, and reflecting the bulk acoustic wave, the first acoustic film and the second acoustic film being alternately stacked on the second electrode film, and the first acoustic film being in contact with the second electrode film, wherein the resonance frequency of the second acoustic film is higher than the resonance frequency of the first acoustic film, wherein the oscillation energy confining film substantially eliminates loss of oscillation energy of the piezoelectric resonator, and wherein a thickness of at least one of the first acoustic film and the second acoustic film is selected to optimize a temperature characteristic and a Q-value of said resonator.

2. The piezoelectric resonator as claimed in claim 1, wherein the first acoustic film comprises $SiO_2$.

3. The piezoelectric resonator as claimed in claim 1, wherein the second acoustic film comprises AlN or ZnO.

4. The piezoelectric resonator as claimed in claim 1, wherein assuming that the wavelength of the bulk acoustic wave is $\lambda$, the thickness of the first acoustic film is 0.125 $\lambda$ or more.

5. The piezoelectric resonator as claimed in claim 1, wherein assuming that the wavelength of the bulk acoustic wave is $\lambda$, the thickness of the first acoustic film falls within the range of 0.275 $\lambda$ to 0.34 $\lambda$, and that of the second acoustic film falls within the range of 0.05 $\lambda$ to 0.225 $\lambda$.

6. The piezoelectric resonator as claimed in claim 1, wherein assuming that the wavelength of the bulk acoustic wave is $\lambda$, the thickness of the first acoustic film falls within the range of 0.18 $\lambda$ to 0.225 $\lambda$, and that of the second acoustic film falls within the range of 0.275 $\lambda$ to 0.35 $\lambda$.

7. The piezoelectric resonator as claimed in claim 1, further comprising:

a third electrode film formed on the oscillation energy confining film;

a piezoelectric film formed on the third electrode film; and a fourth electrode film formed on the piezoelectric film and obtaining, in collaboration with the third electrode film, a signal having a predetermined resonance frequency by a propagation of a bulk acoustic wave inside the piezoelectric film.

8. The piezoelectric resonator as claimed in claim 7, wherein the second acoustic film is in contact with the third electrode film.

9. The piezoelectric resonator as claimed in claim 7, wherein the second acoustic film comprises AlN.

10. The piezoelectric resonator as claimed in claim 1, wherein the piezoelectric resonator comprises an SMR-type piezoelectric resonator or a diaphragm-type piezoelectric resonator.

11. A filter comprising the piezoelectric resonator as claimed in claim 1.

12. An electronic component comprising the filter as claimed in claim 11.

13. The electronic component as claimed in claim 12, wherein the filter is mounted on a substrate and sealed with a resin.

14. An electronic component comprising the piezoelectric resonator as claimed in claim 1.

15. The electronic component as claimed in claim 14, wherein the piezoelectric resonator is mounted on a substrate and sealed with a resin.

16. The piezoelectric resonator as claimed in claim 1, wherein the second electrode film forms an uppermost electrode film in the piezoelectric resonator and the oscillation energy confining film is disposed on an upper surface of the second electrode film.

17. The piezoelectric resonator as claimed in claim 1, wherein the oscillation energy confining film substantially brings said piezoelectric film to a free oscillation state.

18. A piezoelectric resonator comprising:

a first electrode film formed on a substrate a piezoelectric film formed on the first electrode film;

a second electrode film formed on the piezoelectric film and obtaining, in collaboration with the first electrode film, a signal having a predetermined resonance frequency by a propagation of a bulk acoustic wave inside the piezoelectric film; and an oscillation energy confining film including a first acoustic film having a predetermined acoustic impedance and a second acoustic film having an acoustic impedance higher than the first acoustic film, and reflecting the bulk acoustic wave, the first acoustic film and the second acoustic film being alternately stacked on the second electrode film, and the first acoustic film being in contact with the second electrode film, wherein assuming that the wavelength of the bulk acoustic wave is $\lambda$, the thickness of the first acoustic film falls within the range of 0.18 $\lambda$ to 0.225 $\lambda$, and that of the second acoustic film falls within the range of 0.05 $\lambda$ to 0.225 $\lambda$, and wherein the oscillation energy confining film substantially eliminates loss of oscillation energy of the piezoelectric resonator, and wherein a thickness of at least one of the first acoustic film and the second acoustic film is selected to optimize a temperature characteristic and a Q-value of said resonator.

19. A piezoelectric resonator having a single piezoelectric film, the piezoelectric resonator comprising:

a first electrode film formed on a substrate;

the single piezoelectric film formed on the first electrode film;

a second electrode film formed on the piezoelectric film and obtaining, in collaboration with the first electrode film, a signal having a predetermined resonance frequency by a propagation of a bulk acoustic wave inside the piezoelectric film; and an oscillation energy confining film including a first acoustic film having a predetermined acoustic impedance and a second acoustic film having an acoustic impedance higher than the first acoustic film, and reflecting the bulk acoustic wave, the first acoustic film and the second acoustic film being alternately stacked on the second electrode film, and the first acoustic film being in contact with the second electrode film, wherein the oscillation energy confining film substantially eliminates oscillation of the piezoelectric resonator, wherein the resonance frequency of the second acoustic film is higher than the resonance frequency of the first acoustic film, and wherein a thickness of at least one of the first acoustic film and the second acoustic film is selected to optimize a temperature characteristic and a Q-value of said resonator.

* * * * *